United States Patent
Di-Giacomo et al.

(10) Patent No.: US 9,670,058 B2
(45) Date of Patent: Jun. 6, 2017

(54) INTEGRATED CIRCUIT PROVIDED WITH A DEVICE FOR DETECTING ITS SPATIAL ORIENTATION AND/OR A MODIFICATION OF THIS ORIENTATION

(71) Applicant: STMicroelectronics (Rousset) SAS, Rousset (FR)

(72) Inventors: Antonio Di-Giacomo, Rousset (FR); Pascal Fornara, Pourrières (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 206 days.

(21) Appl. No.: 14/501,537

(22) Filed: Sep. 30, 2014

(65) Prior Publication Data
US 2015/0014794 A1  Jan. 15, 2015

Related U.S. Application Data

(63) Continuation of application No. PCT/EP2012/072874, filed on Nov. 16, 2012.

(30) Foreign Application Priority Data

Apr. 2, 2012  (FR) ..................... 12 52988

(51) Int. Cl.
*B81B 7/02* (2006.01)
*G01P 13/00* (2006.01)
(Continued)

(52) U.S. Cl.
CPC .............. *B81B 7/02* (2013.01); *B81B 3/0051* (2013.01); *B81C 1/00174* (2013.01);
(Continued)

(58) Field of Classification Search
CPC . H01L 2224/16225; H01L 2224/48145; H01L 2224/484; H01L 2224/73265;
(Continued)

(56) References Cited

U.S. PATENT DOCUMENTS 6,377,438 B1  4/2002  Deane et al.
6,498,347 B2  12/2002  Sauer et al.
(Continued)

FOREIGN PATENT DOCUMENTS

DE  4229837 A1  3/1993
EP  1734550 A1  12/2006
(Continued)

OTHER PUBLICATIONS

Bouwstra, S. et al., "Thermal Base Drive for Micromechanical Resonators Employing Deep-Diffusion Bases," Sensors and Actuators, vol. 37-38, 1993, pp. 38-44.
(Continued)

*Primary Examiner* — Eliseo Ramos Feliciano
*Assistant Examiner* — Joannie A Garcia
(74) *Attorney, Agent, or Firm* — Slater Matsil, LLP (57) ABSTRACT

An integrated circuit includes a mechanical device for detection of spatial orientation and/or of change in orientation of the integrated circuit. The device is formed in the BEOL and includes an accommodation whose sides include metal portions formed within various metallization levels. A mobile metal component is accommodated within the accommodation. A monitor inside the accommodation defines a displacement area for the metal component and includes electrically conductive elements disposed at the periphery of the displacement area. The component is configured so as to, under the action of the gravity, come into contact with the two electrically conductive elements in response to a given spatial orientation of the integrated circuit. A detector is configured to detect an electrical link passing through the component and the electrically conductive elements.

25 Claims, 8 Drawing Sheets

(51) Int. Cl.
*G01P 15/135* (2006.01)
*G01C 9/12* (2006.01)
*B81C 1/00* (2006.01)
*B81B 3/00* (2006.01)

(52) U.S. Cl.
CPC ............ *B81C 1/00246* (2013.01); *G01C 9/12* (2013.01); *G01P 13/00* (2013.01); *G01P 15/135* (2013.01); *B81B 2201/0235* (2013.01); *B81B 2201/0292* (2013.01); *B81C 2203/0714* (2013.01); *B81C 2203/0771* (2013.01)

(58) Field of Classification Search
CPC ..... H01L 2924/181; H01L 2924/10253; H01L 2924/1461; H01L 2225/06541; H01L 23/147; H01L 23/481; H01L 23/5382; H01L 23/5226; H01L 23/5386; H01L 21/481; H01L 21/486; H01L 21/768
USPC ...... 257/48, 64, 69, 204, 692, 774, E23.141, 257/E23.142, E23.145, E23.151, E23.169, 257/E23.175, E21.575, E21.627, E21.036, 257/E21.233, E29.003, E33.003; 438/52, 438/128, 199, 421, 422, 598, 618, 622, 438/629, 637, 672, 675
See application file for complete search history.

(56) References Cited

U.S. PATENT DOCUMENTS

| | | | |
|---|---|---|---|
| 7,657,995 | B2 | 2/2010 | Hsu et al. |
| 7,960,804 | B1 | 6/2011 | Ebel et al. |
| 8,264,054 | B2 | 9/2012 | Cunningham et al. |
| 8,604,898 | B2 | 12/2013 | Anderson et al. |
| 8,609,450 | B2 | 12/2013 | Gambino et al. |
| 8,610,256 | B2 | 12/2013 | Fornara et al. |
| 8,692,247 | B2 | 4/2014 | Fornara et al. |
| 8,704,327 | B2 | 4/2014 | Rivero et al. |
| 8,847,376 | B2 * | 9/2014 | Oganesian .......... H01L 23/5389 257/686 |
| 2005/0146404 | A1 | 7/2005 | Yeatman |
| 2005/0189204 | A1 | 9/2005 | Yeatman et al. |
| 2006/0145793 | A1 | 7/2006 | Ning et al. |
| 2006/0285255 | A1 | 12/2006 | Kawakubo et al. |
| 2007/0183116 | A1 | 8/2007 | Combi et al. |
| 2010/0116632 | A1 | 5/2010 | Smith et al. |
| 2010/0158072 | A1 | 6/2010 | Fornara et al. |
| 2010/0295138 | A1 | 11/2010 | Montanya Silvestre et al. |
| 2011/0037132 | A1 | 2/2011 | Hsu et al. |
| 2011/0037160 | A1 | 2/2011 | Hsu et al. |
| 2011/0051309 | A1 | 3/2011 | Furukawa et al. |
| 2011/0063773 | A1 | 3/2011 | Ikehashi |
| 2012/0090393 | A1 | 4/2012 | Montanya Silvestre et al. |
| 2012/0134121 | A1 | 5/2012 | Kanemoto et al. |
| 2013/0147004 | A1 | 6/2013 | Rivero et al. |
| 2014/0138814 | A1 | 5/2014 | Marzaki et al. |
| 2014/0167908 | A1 | 6/2014 | Fornara et al. |
| 2014/0191385 | A1 | 7/2014 | Di-Giacomo |

FOREIGN PATENT DOCUMENTS

| | | |
|---|---|---|
| EP | 2154635 A1 | 2/2010 |
| EP | 2202767 A1 | 6/2010 |
| FR | 1252988 A | 2/1961 |
| FR | 1350161 A | 1/1964 |
| FR | 2681178 A1 | 3/1993 |
| FR | 2984013 A1 | 6/2013 |
| FR | 2988712 A1 | 10/2013 |
| KR | 20110066395 A | 6/2011 |
| WO | 2005045868 A1 | 5/2005 |
| WO | 2005069331 A1 | 7/2005 |
| WO | 2011157882 A2 | 12/2011 |

OTHER PUBLICATIONS

Dereus, D.R. et al., "Tunable Capacitor Series/Shunt Design for Integrated Tunable Wireless Front End Applications," MEMS 2011, Cancun, Mexico, Jan. 23-27, 2011, 4 pages.

Kaynak, M. et al., "Characterization of an Embedded RF—MEMS Switch," IEEE, date of conference Jan. 11-13, 2010, 4 pages.

Liao, K.M. et al., "A Novel Electro-Thermally Driven Bi-Directional Microactuator," 2002 International Symposium on Micromechatronics and Human Science, 2002, 8 pages.

Parameswaran, M. et al., "CMOS Electrothermal Microactuators," IEEE Proceedings of Micro Electro Mechanical Systems, Feb. 11-14, 1990, 4 pages.

Vayrette, R. et al., "Residual stress estimation in damascene copper interconnects using embedded sensors," Microelectronic Engineering 87 (2010), May 22, 2009, 4 pages.

\* cited by examiner

INTEGRATED CIRCUIT PROVIDED WITH A DEVICE FOR DETECTING ITS SPATIAL ORIENTATION AND/OR A MODIFICATION OF THIS ORIENTATION

This patent application is a continuation of PCT/EP/2012/072874, filed on Nov. 16, 2012, which claims the benefit of French Application No. 1252988, filed on Apr. 2, 2012 (issued on Apr. 11, 2014 as FR2988712), which applications are hereby incorporated herein by reference.

TECHNICAL FIELD

The invention relates to integrated circuits, and more particularly to detectors of spatial orientation and/or of change in spatial orientation of these integrated circuits.

BACKGROUND

At the present time, detectors of position and/or of orientation can be of the MEMS (Micro Electro Mechanical Systems) type using elements made of polysilicon, or again may comprise accelerometers.

Such detectors of position and of orientation, having very short response times, so as to be usable for example in video game joysticks, require a dedicated technology for their fabrication, which is difficult to integrate into a standard CMOS technology process line.

SUMMARY

According to one embodiment, a novel mechanical device is provided for detection of spatial orientation and/or of change in spatial orientation of an integrated circuit, which may be integrated into all CMOS technology process lines, possibly with the inclusion of only a few additional operations (the addition of one level of mask, for example), and without using the conventional technology of the MEMS type.

According to one embodiment, a mechanical device is also provided for detection of spatial orientation and/or of change in spatial orientation of the integrated circuit, which has a limited impact in terms of surface area on the integrated circuit.

According to one aspect, an integrated circuit is provided comprising, on top of a substrate, a part comprising several levels of metallization separated by an insulating region. Such a part is commonly denoted by those skilled in the art under the acronym BEOL (Back End Of Line).

According to a general feature of this aspect, the integrated circuit furthermore comprises, within the part, at least one mechanical device for detection of spatial orientation and/or of change in spatial orientation of the integrated circuit.

This mechanical detection device comprises an accommodation whose sides comprise metal portions formed within various metallization levels, a metal component accommodated within the accommodation and being mobile inside the accommodation, a monitor defining a displacement area for the metal component inside the accommodation. The monitor comprises at least two electrically conductive elements, for example pillars comprising a stack of metal portions and vias, disposed around the edge of the displacement area. The component is furthermore configured so as to, under the action of gravity, come into contact with the at least two electrically conductive elements in response to at least one given spatial orientation of the integrated circuit. The integrated circuit furthermore comprises a detector configured to detect an electrical link passing through the component and the at least two electrically conductive elements.

Such a detection device is thus formed in the part known as BEOL of integrated circuits within several metallization levels, and therefore has an essentially metal structure. It is therefore readily integrated into a CMOS technology process line using largely the conventional steps for fabrication of the BEOL part of the integrated circuit.

The mobile component, which comprises for example at least a first block having a thickness equal to the thickness of one metallization level, is advantageously formed within at least one metallization level of the integrated circuit in a manner analogous to that used for forming the interconnection metal tracks of the BEOL part, this component being initially encapsulated within the insulating region of the BEOL part, then released so as to become mobile, after etching of this insulating region.

The electrically conductive elements, situated at the edge of the displacement area of the component, are also advantageously formed in a manner analogous to the formation of portions of metal tracks and of vias of the BEOL part.

The detection of the orientation or of the change in orientation of the integrated circuit is therefore based on the very simple principle of the displacement of the metal component inside its displacement area so as to come into contact with at least two electrically conductive elements. The presence of an electrical link passing through these electrically conductive elements and through the component consequently means that the integrated circuit has a given orientation or at least a given range of orientations.

This device, with a very simple operation and easy to fabricate, is mainly designed to detect static or quasi-static orientations of the device or else a change in orientation with low-frequency movements. It is therefore very clearly differentiated from the sophisticated devices based on MEMS requiring a dedicated fabrication technology leading to the use of a greater surface area.

Various embodiments of the metal component and of the monitor are possible, notably allowing a controlled sliding of the element or else a tilting of the latter about an axis and also, in certain cases, allowing the detection of the overturning of the integrated circuit.

BRIEF DESCRIPTION OF THE DRAWINGS

Other advantages and features of the invention will become apparent upon examining the detailed description of non-limiting embodiments and of the appended drawings in which.

DETAILED DESCRIPTION OF ILLUSTRATIVE EMBODIMENTS

Figure 1:
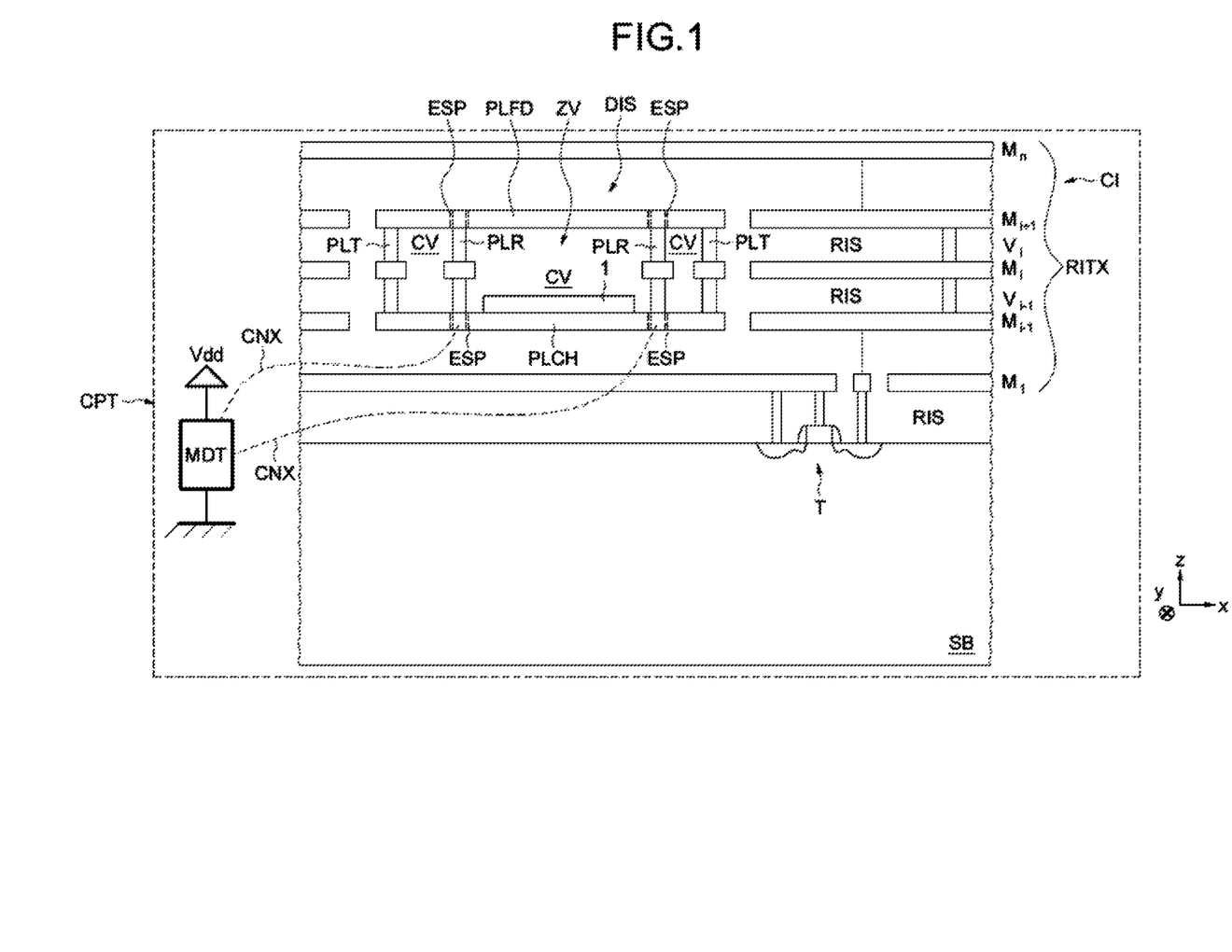
FIGS. 1 to 12, essentially schematic, relate to various embodiments of an integrated circuit according to the invention.

If reference is made to FIG. 1, it can be seen that the device DIS for detection of spatial orientation and/or of the change in orientation of the integrated circuit CI is formed within several metallization levels (here three metallization levels $M_{i-1}$, $M_i$, $M_{i+1}$ and two levels of vias $V_{i-1}$, $V_i$) of the interconnection part RITX of the integrated circuit CI, this interconnection part also being commonly denoted by those skilled in the art by the acronym BEOL.

This interconnection part is situated on top of the substrate SB, and on top of the components, such as the transistors T, formed within and on the substrate SB.

As is conventional in this technology, the metal tracks formed within the various metallization levels of the integrated circuit are, for some of them, connected together by interconnection holes or vias $V_{i-1}$, $V_i$, etc., all of these tracks and vias being encapsulated within an insulating region RIS.

The device DIS comprises an accommodation or cavity CV whose sides comprise metal portions formed within various metallization levels.

In the present case, the device DIS comprises a base side PLCH formed in the metallization level $M_{i-1}$, a top side PLFD formed in the metallization level $M_{i+1}$ and a sidewall PLT comprising metal portions formed in the metallization level $M_i$ and vias formed at the via levels $V_{i-1}$ and $V_i$.

The device DIS also comprises a metal component 1 accommodated within the accommodation CV and being mobile inside this accommodation.

As will be seen hereinafter in more detail on various embodiments, the device DIS also comprises a monitor, for example pillars PLR, defining a displacement area ZV for the metal component inside the accommodation and comprising at least two electrically conductive elements, for example the pillars PLR, disposed at the periphery of the displacement area.

The metal component 1 is configured so as to, under the action of gravity, come into contact with the pillars PLR in response to at least one given spatial orientation of the integrated circuit.

The integrated circuit also comprises a detector MDT configured for detecting an electrical link passing through the component and the electrically conductive elements PLR.

The detector MDT is, in the example described, connected to the pillars PLR via a connection CNX which can be formed in various ways, for example by means of vias and of metal tracks at different levels of the integrated circuit.

Furthermore, in some cases, it may be necessary to electrically isolate the pillars PLR from the base and top sides PLCH and PLFD. In this case, an isolating gap ESP is formed around the metal portion of the side PLCH which supports a pillar PLR.

The structure and the formation of such a gap ESP will be described in more detail hereinafter.

The detector MDT, supplied between a power supply voltage Vdd and ground, has a conventional and known structure. For this purpose, any suitable logic circuit may be used.

The detector MDT has been shown schematically outside of the integrated circuit. This could effectively be the case if the detector MDT takes the form of a component separate from the integrated circuit. The detector MDT could, of course, also be integrated into the integrated circuit CI.

As will be seen in more detail hereinafter, in this example, the component 1 is initially a metal portion of the metallization level Mi encapsulated in a part of an insulating region. After etching away this part of the insulating region, in such a manner as to form the cavity CV, the component 1 becomes mobile and, in the case illustrated in FIG. 1, falls by gravity onto the base side PLCH.

When the integrated circuit is in a horizontal position, as illustrated in FIG. 1, the component 1 and the pillars PLR are mutually arranged in such a manner that the component 1 does not come into contact with at least two pillars PLR. No electrical link is detected by the detector MDT. Accordingly, this is representative of an integrated circuit CI lying flat.

In contrast, if the integrated circuit CI is inclined, the components 1 will then, under the action of gravity, slide along the base side PLCH so as to come into contact with at least two pillars PLR. An electrical link between these two pillars PLR will be detectable by the detector MDT. Depending on the location of the pillars PLR with which the component 1 has come into contact, it may then be detected that the integrated circuit CI has adopted a given orientation, or, at the very least, has an orientation within a given range of orientations.

In an even simpler application, the device DIS can be used to detect a change in orientation. Thus, in an initial condition, the mobile component 1 can be in contact, or not in contact, with two pillars PLR leading to the establishment, or otherwise, of an electrical link between these two pillars. This defines an initial condition of orientation of the integrated circuit and, if during a movement of the integrated circuit CI, either an electrical link appears (whereas there wasn't one beforehand), or an electrical link disappears (whereas there was one beforehand), or another electrical link appears between two other pillars for example, this then means that the integrated circuit has undergone a detectable change in orientation.

One possible application of the invention is a motion sensor designed to be fixed onto an object, for example a rock. The motion sensor CPT then contains the integrated circuit CI. Once installed on the rock, the integrated circuit CI, and consequently the device DIS, have an initial orientation detected by the detector MDT as indicated previously. If, at a given moment, the rock starts to move leading to a change in orientation of the integrated circuit, this movement can then be detected by the device DIS. A signal can then be transmitted by radio to a remote control system and thus be interpreted as a risk of onset of a landslide.

Other applications are possible, such as for example detection of a ground slip, of the stability of a house, without this list being exhaustive.

Figure 2:
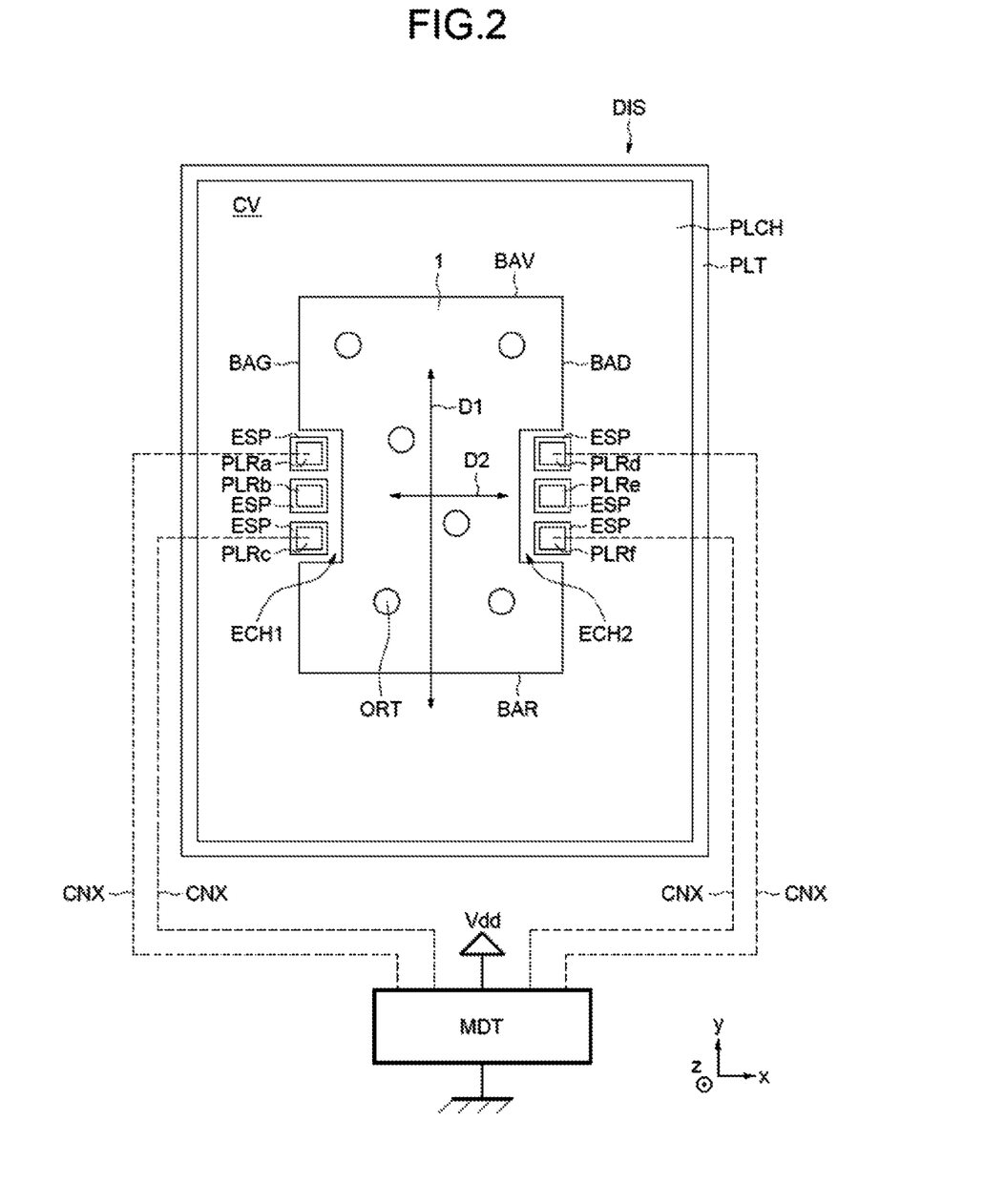

Reference is now more particularly made to FIG. 2, which illustrates, in a more detailed manner, a first embodiment of a device for detection of spatial orientation of the integrated circuit.

In this embodiment, the component 1 is a single piece and has a thickness equal to the thickness of one metallization level.

For the purposes of simplification, in FIG. 2, which is a schematic top view, the top side PLFD of the accommodation CV is not shown.

By way of example, the thickness of the component 1 can be in the range 0.3 to 0.5 micron.

The component 1 here comprises two scalloped parallel edges running in the direction D1. By way of example, the length of the component 1, measured in the direction D1, can for example be in the range between 3 microns and 20 microns, whereas the width of the component 1, measured in the direction D2, can for example be in the range between 2 and 10 microns.

Several pairs of electrically conductive pillars run between the base side PLCH and the top side PLFD while being electrically isolated from these sides, here by virtue of the isolating gaps ESP.

Each pillar here comprises a portion of metal line situated at the lower metal level (for example, the metal $M_{i-1}$), a metal portion situated in the metal level $M_i$, and a metal portion situated in the metal level $M_{i+1}$.

The lower metal portion is connected to the median metal portion by a via situated at the via level $V_{i-1}$ and the median metal level is connected to the upper metal portion by another via situated at the via levels $V_i$.

The height of these vias is for example around 0.3 micron for copper and around 0.5 micron for aluminium, and these are valid for technological processes using chemical-mechanical polishing steps, as is the case for example for technological nodes going from 250 nm to 65 nm. However, these vias may be higher in the case of older technological processes.

The pairs of electrically conductive pillars are disposed within the scallops ECH1 and ECH2 of the parallel longitudinal edges, and the pillars of each pair are respectively situated opposite each other within the two scallops ECH1, ECH2.

More precisely, a first pair of pillars comprises the pillar PLRa disposed within the scallop ECH1 and the pillar PLRd disposed within the scallop ECH2.

A second pair of pillars comprises the pillar PLRc disposed within the scallop ECH1 and the pillar PLRf disposed within the scallop ECH2.

The pillars are spaced from the sidewall PLT of the accommodation CV by a distance for example equal to 0.3 micron, and the small sides of the component 1 are spaced from the sidewall PLT by a distance which may also be equal to 0.3 micron.

It can therefore be seen that at least one edge of the component 1 and, in this case, the two scalloped longitudinal edges of the component form, with the electrically conductive elements (the pillars PLR), a guide for the movement of the component. This guide comprises the scallops ECH1, ECH2 and the pillars PLRa, PLRd, PLRc and PLRf.

The detector MDT is connected to the first pair of pillars PRa, PLRd and to the second pair of pillars PLRc, PLRf.

It is assumed here that, when the integrated circuit CI is lying flat, as illustrated in FIG. 1, the component 1 is in the configuration illustrated in FIG. 2 with the component not in contact with any of the pillars.

If, subsequent to an inclination of the integrated circuit, the front edge BAV is raised, the component will slide towards the rear and come into contact with the pillars PLRa and PLRd. An electrical link can therefore be established via these pillars and the component 1.

If, on the other hand, it is the rear edge BAR that is raised, the component 1 will slide in the other direction so as to come into contact with the pillars PLRc and PLRf. This time, the electrical link passes via these pillars and the component 1.

If, during another inclination, the left-hand longitudinal edge BAG is raised, the component will slide towards the right, coming into contact with the pillars PLRd and PLRf. The electrical link therefore passes via the component 1 and via its pillars.

If, on the other hand, it is the right-hand longitudinal edge BAD which is raised, the component 1 will slide towards the left so as to come into contact with the pillars PLRa and PLRc.

The device such as illustrated in FIG. 2 therefore allows at least four different ranges of orientation to be detectable for the integrated circuit.

It should be noted here that an additional pair of pillars PLRb-PLRe is disposed between the aforementioned pairs PLRa-PLRd and PLRc-PLRf. However, this additional pair is not indispensable from the electrical point of view, but can be advantageous for enhancing the rigidity of the guide.

Although not indispensible, it is however particularly advantageous, for reasons that will be explained in more detail hereinafter, for the component 1 to comprise at least one through-orifice ORT and, preferably, several through-orifices ORT.

Figure 3:
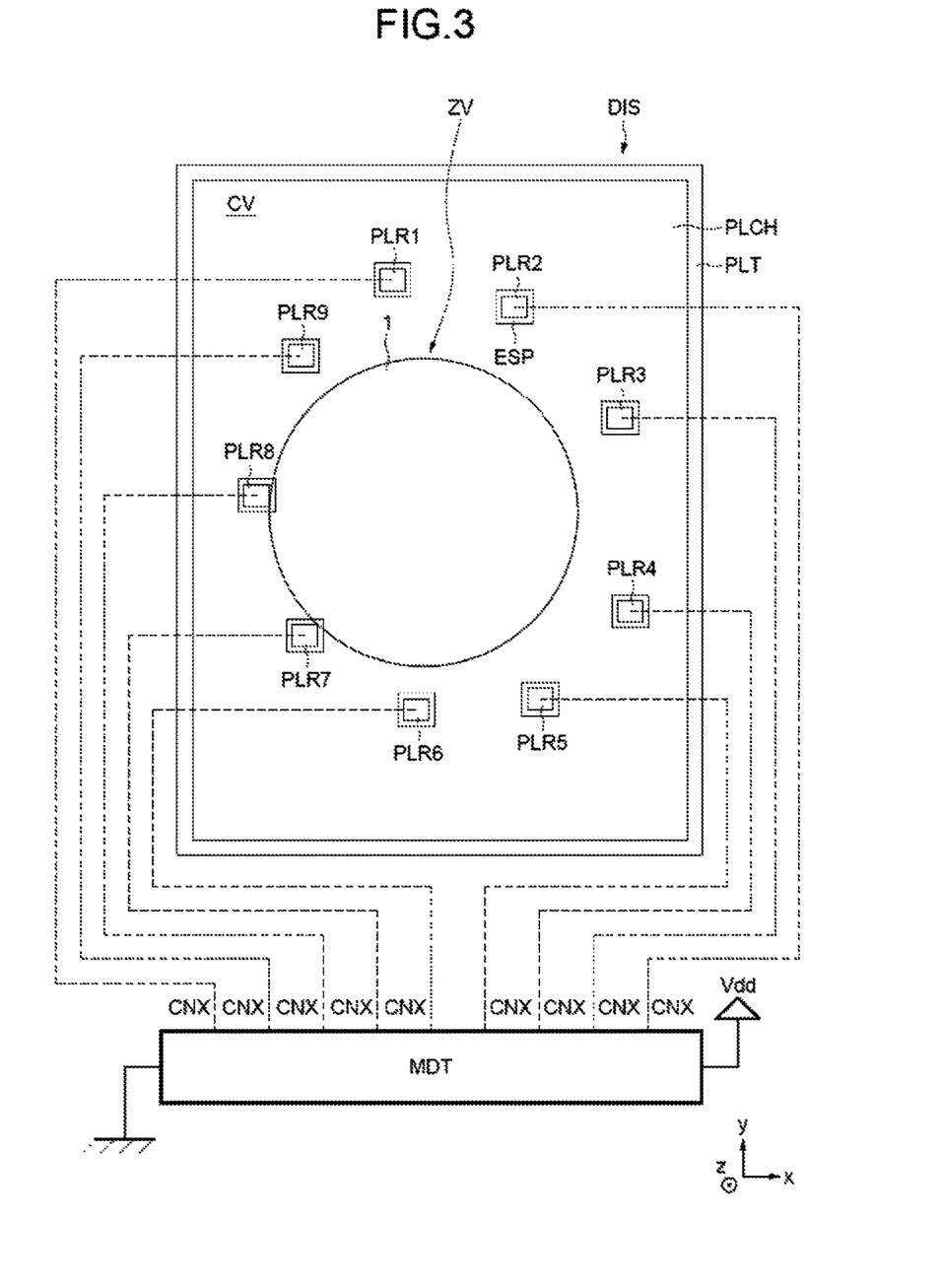

In the embodiment in FIG. 3, the component 1 is cylindrical and is, more particularly, a cylindrical pancake-shaped single piece. The monitor for the movement of the component 1 comprise several electrically conductive pillars, typically more than 4, here for example nine pillars PLR1-PLR9, disposed around the component 1, also running between the base side PLCH and the top side PLFD (not shown in FIG. 3 by analogy with FIG. 2); these electrically conductive elements (pillars) form several pairs of electrically conductive elements allowing a larger number of spatial orientations or of ranges of spatial orientations of the integrated circuit to be detected.

The detector MDT is connected to each of the pillars via connections CNX.

The displacement area ZV for the mobile component 1 is here therefore bounded by the pillars PLR1-PLR9.

So, depending on the spatial orientation of the integrated circuit, and consequently of the device DIS, the pancake component 1 will slide on the side PLCH so as to come into contact with one pair of pillars from amongst the aforementioned nine pillars. The detector will then be able to detect an electrical link passing through the component 1 and the pair of pillars contacted.

Figure 4:
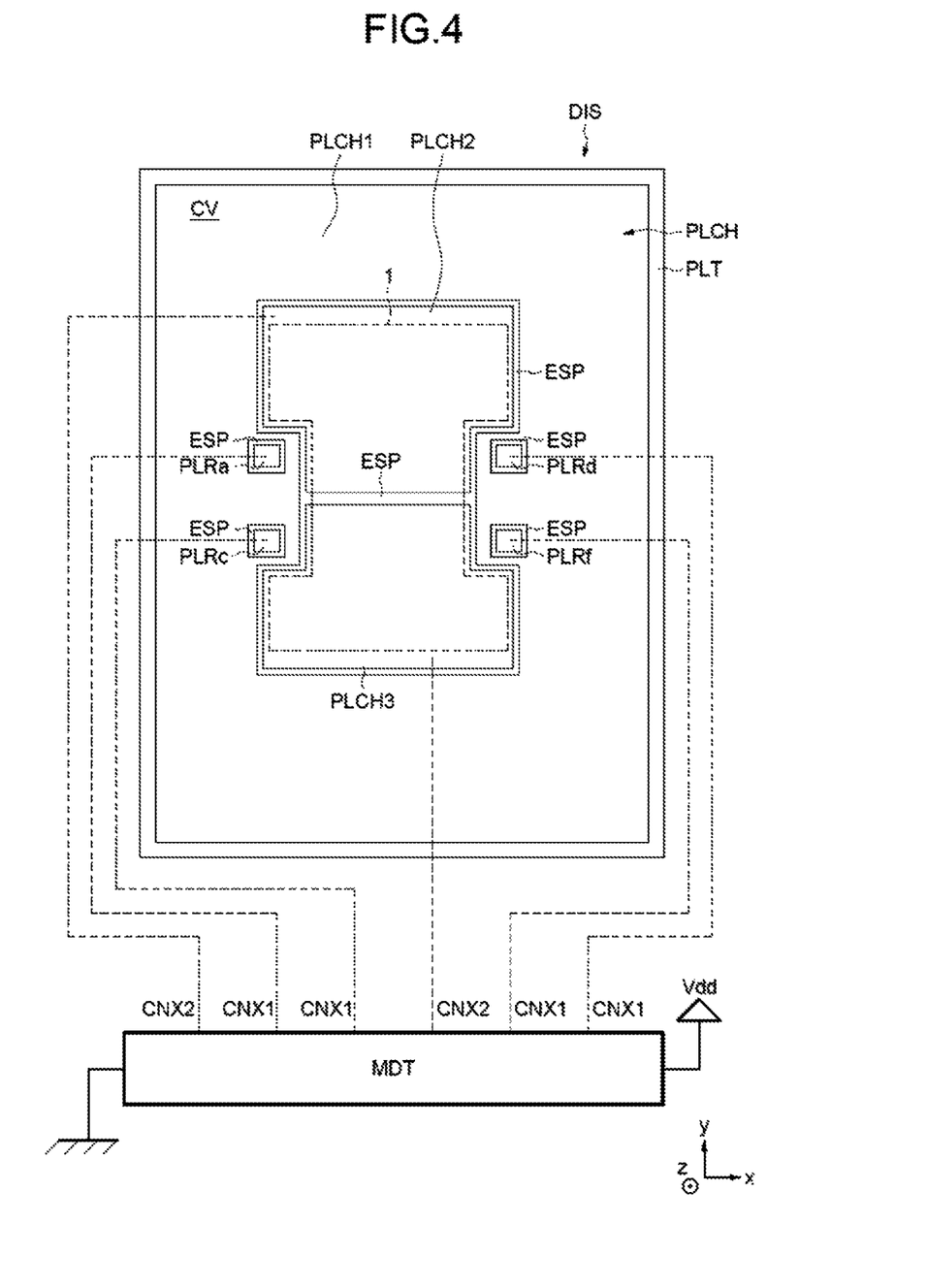

The embodiment illustrated in FIG. 4 differs from that illustrated in FIG. 2 by the structure of the base side PLCH and of the top side PLFD.

Furthermore, for the purposes of simplification of FIG. 4, only the pillars PLRa, PLRd, PLRc, PLRf have been shown owing to the redundancy of the pillars PLRd and PLRe in FIG. 2.

The base side PLCH comprises a peripheral metal portion PLCH1 and two separate metal portions PLCH2, PLCH3 forming a pair of electrically conductive elements different from the pairs of electrically conductive elements formed by the pillars. The top side has a structure analogous to that of the base side and hence also comprises two separate metal portions forming another pair of electrically conductive elements.

The portions PLCH2 and PLCH3 are electrically isolated from each other by a gap ESP, and these portions are also electrically isolated from the peripheral portion PLCH1 by a gap ESP.

These two portions PLCH2 and PLCH3 are also connected to the detector MDT via connections CNX1, for example by means of vias and of portions of metal lines running in the BEOL part of the integrated circuit under the base side PLCH.

The embodiment in FIG. 4 allows it to be known whether the integrated circuit is resting on the base side, as illustrated in FIG. 1, or else whether it is overturned corresponding to the mobile element resting this time on the top side.

Indeed, if the mobile component 1 rests on the base side PLCH, it consequently rests on the separate metal portions PLCH2 and PLCH3, and therefore enables the establishment of an electrical link passing through itself and also via its portions PLCH2 and PLCH3. The detector MDT is therefore capable of detecting such an electrical link.

If, on the other hand, the integrated circuit is overturned, the mobile element rests on the separate metal portions of the top side, and the detector MDT is then capable of detecting such a position of the integrated circuit by the detection of an electrical link passing through the mobile component 1 and the separate metal portions of the top side.

It goes without saying that such a structure of the base and top sides can also be applied to any other embodiment of the device, in particular to that illustrated in FIG. 3.

In these embodiments providing a sliding of the mobile element on one side, the forces acting on the mobile component are its weight (gravity) and Van der Waals forces.

A quick calculation shows that the component 1 can slide on the side as long as its thickness or height h is greater than or equal to a thickness $H_{min}$ defined by the formula (1) hereinbelow:

$$H_{min} = \frac{12\varepsilon}{\rho g} \frac{S}{\Sigma} \quad (1)$$

in which
 $\varepsilon$ represents the surface energy of the metal,
 $\rho$ denotes the density of the metal,
 g the acceleration, the universal gravitational constant (9.81 meters/second),
 $\Sigma$ is the geometrical surface area of the part of the mobile element in contact with the side, and
 S is the effective surface area of contact between the element and the side.

The ratio $S/\Sigma$ can be variable and will depend on the roughness of the surface of the material used.

Thus, for copper, which is an example of a material usually employed for forming the metal tracks of the BEOL part of the integrated circuit, and consequently for forming the mobile component 1, the ratio $S/\Sigma$ is around 10%.

Also, given that density of the copper is equal to 8920 kg/m³, the value $H_{min}$ is around 0.1 micron.

It can therefore be seen that this minimum value is perfectly compatible with the thicknesses of metal lines usually employed in standard CMOS process lines. Indeed, the thickness (height) of a metal line made of copper is generally in the range between 0.3 and 0.5 micron.

Nevertheless, another material which can be used for the metal lines of the BEOL part, and hence for the mobile component 1 of the device DIS, is aluminum, which has a density equal to 1700 kg/m3.

Aluminum has the advantage of being rougher than the copper and consequently of exhibiting a ratio $S/\Sigma$ much lower than the ratio $S/\Sigma$ of copper.

Consequently, the value $H_{min}$ is much lower in the case of aluminium than in the case of copper, which offers a greater flexibility in terms of thickness for the component 1.

Figure 5:
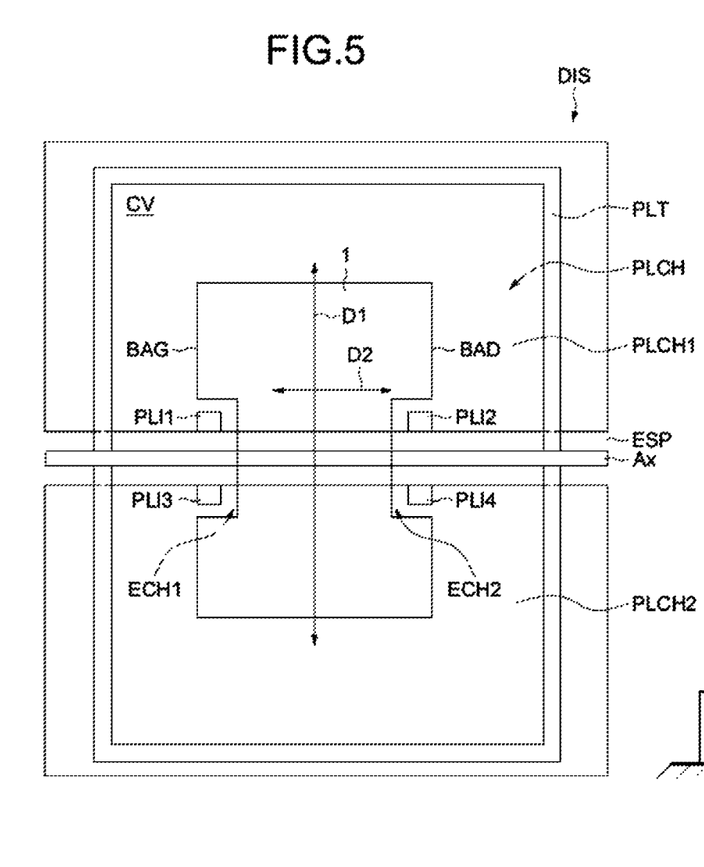
Figure 6:
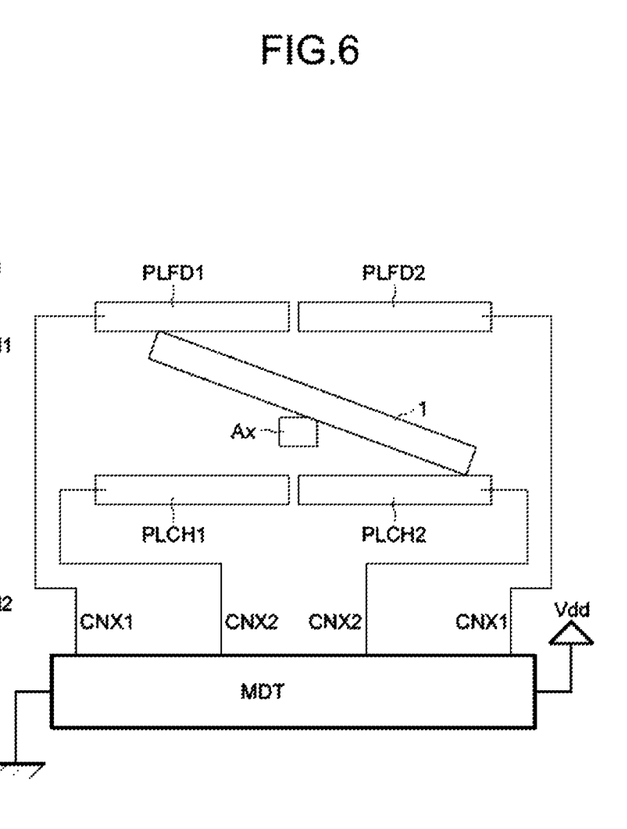

However, the embodiment illustrated schematically in FIGS. 5 and 6 is less sensitive to the effect of Van der Waals forces.

More precisely, in this embodiment, the base side PLCH of the accommodation CV comprises two separate metal portions PLCH1, PLCH2, and the top side also comprises two separate metal portions PLFD1, PLFD2.

The mobile component 1 has a structure analogous to that which has been described with reference to FIG. 2.

It accordingly comprises two parallel scalloped edges BAD, BAG.

The monitor for the movement of the component 1 here comprise two pairs of electrically insulating pillars PLI1, PLI and PLI3, PLI4, disposed within the scallops ECH1, ECH2 of the two parallel edges.

The two insulating pillars PLI1, PLI2 of the first pair are respectively situated opposite each other within the two scallops ECH1, ECH2, and the two insulating pillars PLI3, PLI4 of the other pair are also respectively situated opposite each other within the two scallops ECH1, ECH2.

The scallops ECH1, ECH2 and the insulating pillars consequently can guide the movement of the component.

The structures of the pillars PLI1-4 are analogous to those of the pillars PLRa-f in FIG. 2 and the insulating nature of these pillars PLI1-4 is obtained for example by depositing an electrically insulating passivation layer on the metal structure of these pillars.

The monitor for the movement of the mobile component 1 also comprise the base and top sides of the accommodation, together with a bar Ax running across the accommodation CV, in the direction D2, in between the base side and the top side and parallel to these sides, and between the two pairs of insulating pillars PLI1, PLI2 and PLI3, PLI4.

This bar Ax forms a support axis for the component 1 which can consequently rest on this bar Ax while at the same time being able to pivot about the latter.

In this embodiment, the two metal portions PLCH1 and PLFD2, belonging respectively to the base and top sides and respectively situated on either side of the support axis Ax, form a first pair of conductive elements.

The other two metal portions PLCH2, PLFD1, belonging respectively to the base and top sides and respectively situated on either side of the support axis Ax, form a second pair of conductive elements.

In practice, during the fabrication of the device, the base side is formed in the metal level $M_{i-2}$, the support axis Ax in the metal level $M_{i-1}$, the component 1 in the metal level $M_i$, and the top side in the metal level $M_{i+1}$.

The pillars PLI1-4 run between the base side and the top side, and the sidewall PLT is formed, in a manner analogous to that which has been previously described, by a stack of metal portions and of vias running from the metal level $M_{i-2}$ up to the metal level $M_{i+1}$ passing through the corresponding via levels After etching away the insulating region encapsulating the various parts of the device, the component 1 falls onto the support axis Ax, and generally takes, except where it is perfectly balanced with respect to the axis Ax, an initial inclination which can be that illustrated in FIG. 6 in which the component 1 contacts the side portions PLFD1 and PLCH2, or else the reverse inclination in which it contacts the portions PLCH1 and PLFD2.

The detector MDT will consequently detect the initial configuration, for example as illustrated in FIG. 6, by detecting an electrical link passing through the component 1 and the metal portions PLFD1 and PLCH2.

If the integrated circuit CI, and consequently the device DIS, are inclined in such a manner that the sides PLFD1 and PLCH1 are lower with respect to the sides PLFD2 and PLCH2, the component 1 keeps the configuration illustrated in FIG. 6 for as long as the angle of inclination does not exceed −90°.

If the angle of inclination exceeds −90°, the component 1 will then move away from the axis Ax so as to come into contact with the portions PLFD1 and PLFD2, which will be detected by the detector MDT.

If, on the other hand, the integrated circuit is inclined in such a manner that the portions PLFD1 and PLCH1 are raised with respect to the portions PLFD2 and PLCH2, the component 1 will, at a given moment, come into contact with the portions PLCH1 and PLFD2 as long as the angle of inclination does not exceed 90°. If the inclination exceeds 90°, the component 1 will here again come into contact with the portions PLFD1 and PLF2.

The detector MDT will here again also be able to detect an electrical link passing through the portions PLCH1 and PLFD2.

It can therefore be seen that this embodiment, less sensitive to the actions of Van der Waals forces, is also less precise in terms of detection of orientation. It does however allow an approximate detection of orientation and allows at least one change in orientation to be detected.

Figure 7:
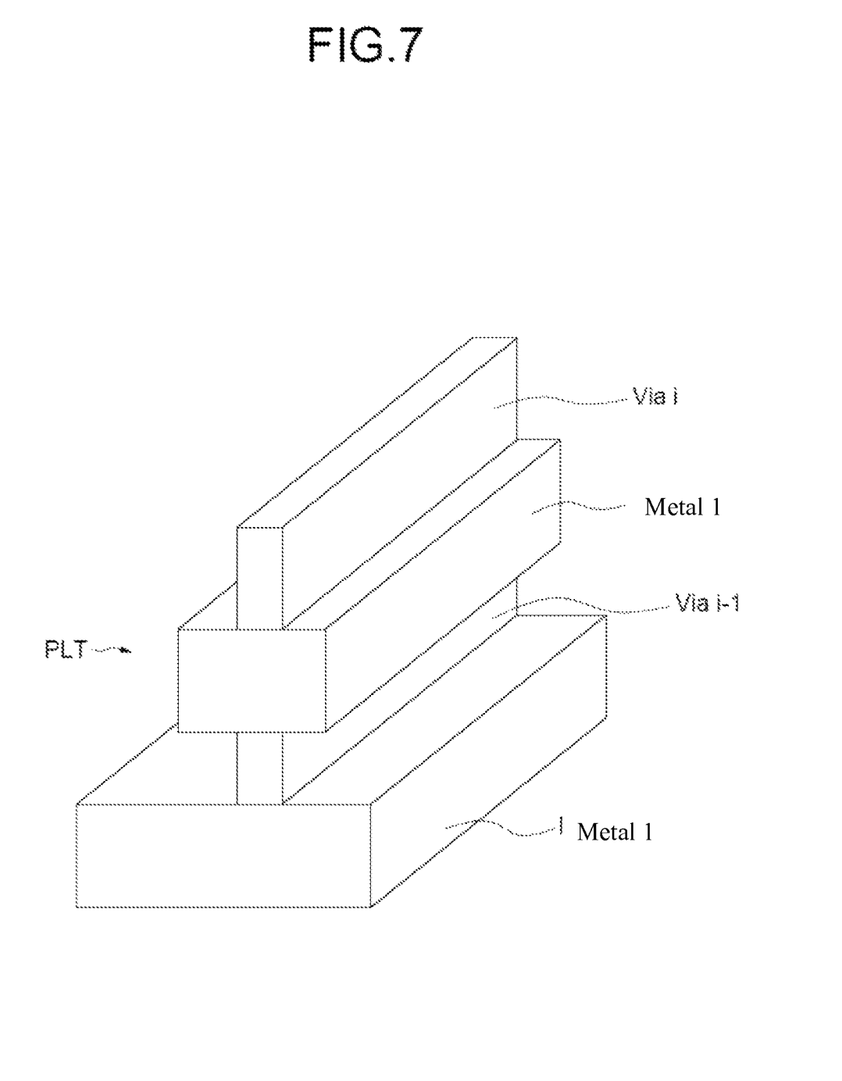
Figure 8:
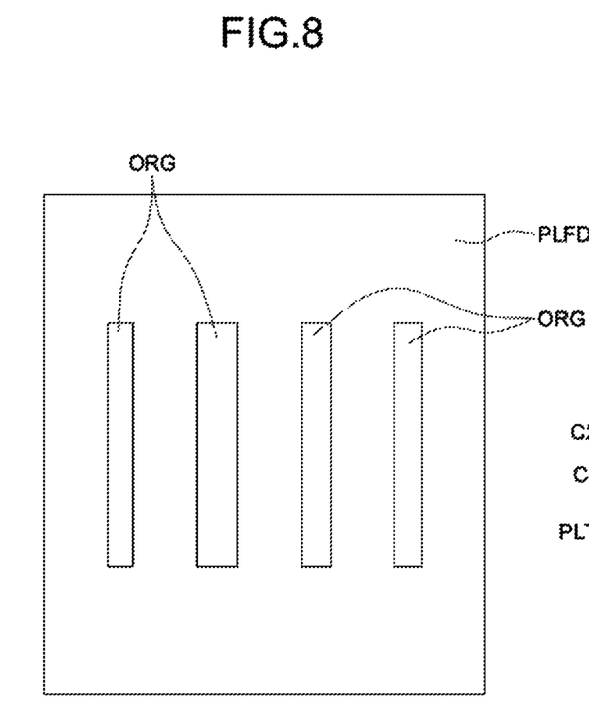
Figure 9:
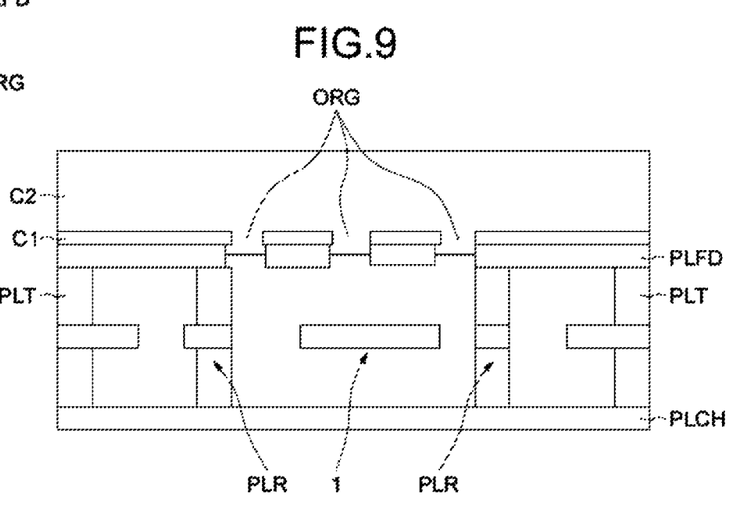

Reference will now more particularly be made to FIGS. 7 to 9 in order to illustrate a mode of fabrication of one exemplary embodiment of a device DIS according to the invention.

In these figures, it is assumed that the component 1 is formed in the metal level i, whereas the base side PLCH and top side PLFD are respectively formed in the metal levels i−1 and i+1.

It is then seen (FIG. 7) that the via levels i−1 and i are used in order to form the sidewall PLT of the accommodation CV and to form a "protection wall" for the etching of the oxide that will follow and to enable the decapsulation of the component 1 and of the pillars PLR.

The device DIS is formed by using conventional steps for the fabrication of metallization levels and of vias. More precisely, as illustrated in FIG. 9, after formation of the metal level i−1 and of the via levels i−1, the component 1 and the metal portions of the pillars PLR are formed in a conventional manner by etching of the underlying oxide and deposition of metal, in this case of copper, in the trenches.

Then, the whole assembly is covered with oxide and the metallization level i+1, together with the via level i, are subsequently formed.

After formation on the metal level i+1 of a conventional layer of nitride C1, the fabrication of a comb in this metal level is carried out so as to form orifices ORG (FIG. 8).

Then, an isotropic dry etching step is carried out followed by a wet etch, for example with hydrogen sulphide, so as to eliminate the insulating region (oxide) encapsulating the component 1, together with the various pillars, and, at the same time, to form the accommodation CV.

Then, a non-conformal deposition of oxide is carried out, so as to form a layer C2 blocking the orifices ORG.

The conventional method for forming the various upper metallization levels is then followed.

It should be noted here that it is particularly advantageous, as already indicated hereinabove, although not indispensable, to provide, within the component 1, through-orifices ORT (FIG. 2). Indeed, this will facilitate the elimination of the oxide encapsulating the element during the various etch steps.

Figure 10:
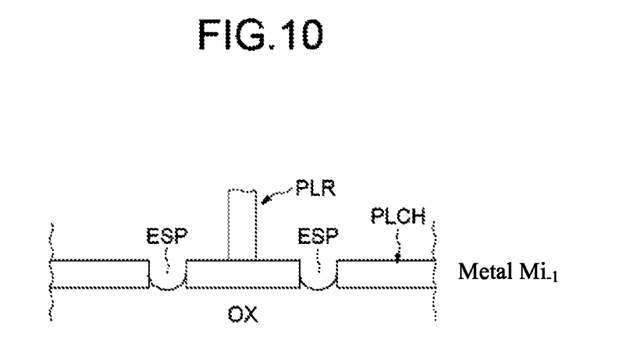

When gaps ESP are required for isolating certain metal parts from other metal parts, as is the case for example in FIG. 2 for the pillars, or in FIG. 4 for the separate metal portions of the base sides, it is preferable to use a sufficiently small dimension for this gap ESP such that the etching of the oxide inside the accommodation does not degrade the oxide OX underlying the lower metal level, for example the metal Mi−1 (FIG. 10).

In this respect, a minimum dimension, for example, of around 0.1 to 0.3 micron for technological nodes of 250 nm to 65 nm will for example be taken as dimensions for the gap ESP. These values can be lower for more advanced technological nodes, or larger in the case of older technological processes.

The etching away of the oxide in the gaps ESP will then be carried out by a conventional over-etch.

In order to make the component 1 less sensitive to Van der Waals forces, its weight can be increased. For this purpose, one solution consists in providing a mobile element comprising at least two parallel blocks rigidly fixed together by at least one lug running perpendicularly to the two blocks, each block having a thickness equal to the thickness of one metallization level, and each lug having a height equal to that of one via level of the BEOL part of the integrated circuit.

Figure 11:
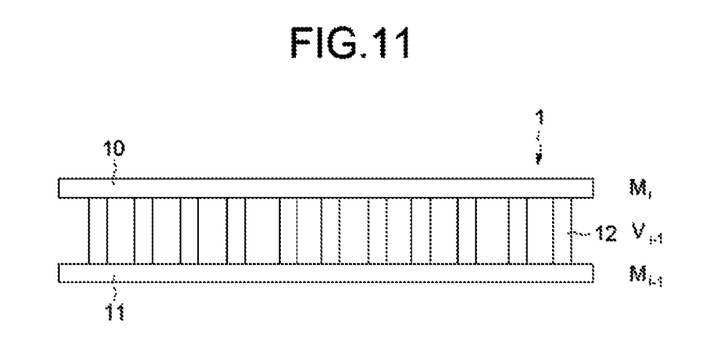
Figure 12:
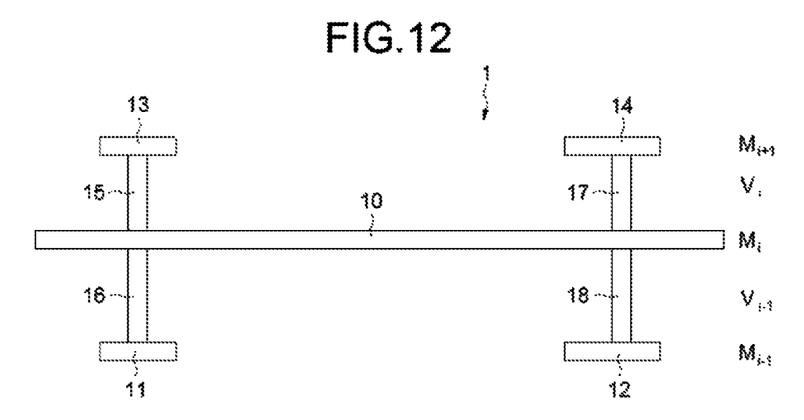

Two possible exemplary embodiments are illustrated in FIGS. 11 and 12.

In FIG. 11, the component 1 comprises two parallel blocks 10 and 11, respectively formed in the metal level Mi−1 and Mi, rigidly fixed together by a plurality of lugs 12 corresponding to vias formed in the via level Vi−1.

Of course, in this case, the base side and the top side are formed in metallization levels respectively lower than the level Mi−1 and higher than the level i.

In the embodiment in FIG. 12, the component 1 comprises a central block 10 formed in the metallization level $M_i$, a first pair of auxiliary blocks 11 and 12 formed in the metallization level $M_{i-1}$, and a second pair of auxiliary blocks 13 and 14 formed in the metallization level $M_{i+1}$.

The auxiliary blocks 11 and 13 are rigidly attached to the main block 10 by lugs 16 and 15, whereas the auxiliary blocks 12 and 14 are rigidly attached to the central block 10 by lugs 18 and 17.

The lugs 15 to 17 are formed by vias at the via level $V_i$ whereas the plots 16 and 18 are formed by vias at the via level $V_{i-1}$.

Here again, the base and top sides are formed in metallization levels respectively lower than the metal level $M_{i-1}$ and higher than the metal level $M_{i+1}$.

It goes without saying that, as far as the fabrication of the device DIS comprising a mobile component 1 extending over several metallization and via levels is concerned, the same method of fabrication as that described with reference to FIGS. 7 to 9 is applicable by simply increasing the number of via levels and the number of metallization levels.

In order to further improve the detection of orientation, the integrated circuit may comprise several devices DIS all having the same embodiment or else different embodiments.

What is claimed is:
1. An integrated circuit, comprising:
    a substrate;
    a metallization region overlying the substrate and comprising a plurality of metallization levels separated by an insulating region;
    a device configured to detect a spatial orientation and/or a change in orientation of the integrated circuit, the device comprising:
        an enclosure having sides comprising metal portions formed within ones of the metallization levels, wherein the sides of the enclosure comprise sidewalls, a base side and a top side;
        a monitor comprising a plurality of electrically conductive elements including electrically conductive pillars extending between the base side and the top side while being electrically isolated from the sidewalls of the enclosure, the electrically conductive elements defining a displacement area; and
        a metal component disposed within the enclosure, the component being mobile within the displacement area of the enclosure, wherein the component is configured to come into contact with the electrically conductive elements in response to the spatial orientation and/or the change in orientation of the integrated circuit; and a detector configured to detect an electrical link passing through the component and the electrically conductive elements.

2. The integrated circuit according to claim 1, wherein the metal component comprises a first block having a thickness equal to a thickness of one metallization level.

3. The integrated circuit according to claim 1, wherein the metal component comprises two parallel blocks rigidly fixed together by a lug aligned perpendicularly to the two blocks, each block having a thickness equal to a thickness of a respective metallization level and the lug having a height equal to that of a via level between the respective metallization levels.

4. The integrated circuit according to claim 1, wherein the sidewalls of the enclosure comprise a through-orifice.

5. The integrated circuit according to claim 1, wherein the electrically conductive elements of the monitor define a plurality of pairs of the elements corresponding respectively to a plurality of different spatial orientations of the integrated circuit.

6. The integrated circuit according to claim 5, wherein the detector is configured to detect an electrical link passing through the component and through at least one pair of the electrically conductive elements.

7. The integrated circuit according to claim 1, wherein the monitor comprises a part of an edge of the component forming, with the electrically conductive elements, a guide for movement of the component.

8. The integrated circuit according to claim 1,
wherein the electrically conductive elements of the monitor define a plurality of pairs of the elements corresponding respectively to several different spatial orientations of the integrated circuit;
wherein the detector is configured to detect an electrical link passing through the component and through at least one pair of the electrically conductive elements;
wherein the monitor comprises a part of an edge of the component forming, with the electrically conductive elements, a guide for movement of the component; and
wherein the component comprises two scalloped parallel edges, and the pairs of electrically conductive elements comprise a plurality of pairs of pillars disposed within the scallops of the two parallel edges, the pillars of each pair being respectively situated opposite each other within the two scallops, the guide comprising the scallops and the pillars.

9. The integrated circuit according to claim 1,
wherein the electrically conductive elements of the monitor define a plurality of pairs of the elements corresponding respectively to several different spatial orientations of the integrated circuit;
wherein the detector is configured to detect an electrical link passing through the component and through at least one pair of the electrically conductive elements; and
wherein the component is cylindrical and the monitor comprises a plurality of electrically conductive pillars disposed around the component and forming the pairs of electrically conductive elements.

10. The integrated circuit according to claim 1, wherein the base side of the enclosure comprises two separate metal portions and wherein the top side of the enclosure comprises two separate metal portions and wherein the component comprises two scalloped parallel edges.

11. The integrated circuit according to claim 10, wherein the monitor comprises:

two pairs of electrically insulating pillars disposed within the scallops of the two parallel edges, the electrically insulating pillars of each pair being respectively situated opposite each other within the two scallops, the scallops and the electrically insulating pillars forming a guide for movement of the component;
the base and top sides of the enclosure;
a bar running across the enclosure between the base side and the top side parallel to these sides and between the two pairs of electrically insulating pillars, the bar forming a support axis for the component; and
the two metal portions, which respectively belong to the base and top sides and are respectively situated on either side of the support axis to form a first pair of the conductive elements, wherein the other two metal portions respectively belong to the base and top sides and are respectively situated on either side of the support axis to form a second pair of the conductive elements.

12. The integrated circuit according to claim 1, wherein base side of the enclosure comprises two separate metal portions forming a pair of the electrically conductive elements, and wherein the top side of the enclosure comprises two separate metal portions forming another pair of the electrically conductive elements.

13. A method of forming an integrated circuit, the method comprising:
providing a semiconductor substrate with a plurality of transistors formed therein;
forming a plurality of metallization layers over the semiconductor substrate, each metallization layer separated by insulating material and structured to form an interconnect region coupled to electrically connect ones of the transistors and a MEMS device configured to detect a spatial orientation and/or a change in orientation of the integrated circuit, the MEMS device formed within an enclosure having sides comprising metal portions formed from ones of the metallization layers; and
removing at least portions of the insulating material from the enclosure so that a component of the MEMS device is movable, wherein the enclosure comprises a plurality of through-orifices and wherein removing at least portions of the insulating material comprises applying an etchant via the through-orifices.

14. The method according to claim 13, wherein, upon completion of forming the integrated circuit, the MEMS device comprises:
the enclosure;
the component of the MEMS device that is movable;
a monitor comprising a plurality of electrically conductive elements that define a displacement area for the component, wherein the component is configured to come into contact with the electrically conductive elements in response to the spatial orientation and/or the change in orientation of the integrated circuit; and
a detector configured to detect an electrical link passing through the component of the MEMS device that is movable and the electrically conductive elements.

15. An integrated circuit, comprising:
a substrate;
a metallization region overlying the substrate and comprising a plurality of metallization levels separated by an insulating region;
a device configured to detect a spatial orientation and/or a change in orientation of the integrated circuit, the device comprising:

an enclosure having sides comprising metal portions formed within ones of the metallization levels;
a metal component disposed within the enclosure, the component being mobile within the enclosure, wherein the component comprises two parallel blocks rigidly fixed together by a lug aligned perpendicularly to the two blocks, each block having a thickness equal to a thickness of a respective metallization level and the lug having a height equal to that of a via level between the respective metallization levels;
a monitor comprising a plurality of electrically conductive elements defining a displacement area for the component inside the enclosure, wherein the component is configured to come into contact with the electrically conductive elements in response to the spatial orientation and/or the change in orientation of the integrated circuit; and
a detector configured to detect an electrical link passing through the component and the electrically conductive elements.

16. An integrated circuit, comprising:
a substrate;
a metallization region overlying the substrate and comprising a plurality of metallization levels separated by an insulating region;
a device configured to detect a spatial orientation and/or a change in orientation of the integrated circuit, the device comprising:
an enclosure having sides comprising metal portions formed within ones of the metallization levels;
a metal component disposed within the enclosure, the component being mobile within the enclosure;
a monitor comprising a plurality of electrically conductive elements defining a displacement area for the component inside the enclosure, wherein the component is configured to come into contact with the electrically conductive elements in response to the spatial orientation and/or the change in orientation of the integrated circuit, wherein the monitor comprises a part of an edge of the component forming, with the electrically conductive elements, a guide for movement of the component; and
a detector configured to detect an electrical link passing through the component and the electrically conductive elements.

17. An integrated circuit, comprising:
a substrate;
a metallization region overlying the substrate and comprising a plurality of metallization levels separated by an insulating region;
a device configured to detect a spatial orientation and/or a change in orientation of the integrated circuit, the device comprising:
an enclosure having sides comprising metal portions formed within ones of the metallization levels, wherein the sides of the enclosure comprise sidewalls, a base side and a top side;
a metal component disposed within the enclosure, the component being mobile within the enclosure, wherein the component comprises two scalloped parallel edges;
a monitor comprising a plurality of electrically conductive elements defining a displacement area for the component inside the enclosure, wherein the component is configured to come into contact with the electrically conductive elements in response to the spatial orientation and/or the change in orientation of the integrated circuit, wherein the electrically conductive elements of the monitor define a plurality of pairs of the elements corresponding respectively to several different spatial orientations of the integrated circuit, wherein the electrically conductive elements comprise electrically conductive pillars running between the base side and the top side while being electrically isolated from the sidewalls, wherein the monitor comprises a part of an edge of the component forming, with the electrically conductive elements, a guide for movement of the component, and wherein the pairs of electrically conductive elements comprise a plurality of pairs of pillars disposed within the scallops of the two parallel edges, the pillars of each pair being respectively situated opposite each other within the two scallops, the guide comprising the scallops and the pillars; and
a detector configured to detect an electrical link passing through the component and through at least one pair of the electrically conductive elements.

18. An integrated circuit, comprising:
a substrate;
a metallization region overlying the substrate and comprising a plurality of metallization levels separated by an insulating region;
a device configured to detect a spatial orientation and/or a change in orientation of the integrated circuit, the device comprising:
an enclosure having sides comprising metal portions formed within ones of the metallization levels, wherein the sides of the enclosure comprise sidewalls, a base side and a top side;
a cylindrical metal component disposed within the enclosure, the component being mobile within the enclosure;
a monitor comprising a plurality of electrically conductive elements defining a displacement area for the component inside the enclosure, wherein the component is configured to come into contact with the electrically conductive elements in response to the spatial orientation and/or the change in orientation of the integrated circuit, wherein the electrically conductive elements comprise a plurality of electrically conductive pillars disposed around the component and running between the base side and the top side while being electrically isolated from the sidewalls, wherein the electrically conductive elements define a plurality of pairs of the elements corresponding respectively to several different spatial orientations of the integrated circuit disposed around the component; and
a detector configured to detect an electrical link passing through the component and the electrically conductive elements, wherein the detector is configured to detect an electrical link passing through the component and through at least one pair of the electrically conductive elements.

19. An integrated circuit, comprising:
a substrate;
a metallization region overlying the substrate and comprising a plurality of metallization levels separated by an insulating region;
a device configured to detect a spatial orientation and/or a change in orientation of the integrated circuit, the device comprising:

an enclosure having sides comprising metal portions formed within ones of the metallization levels, wherein the enclosure comprises a base side comprising two separate metal portions and a top side comprising two separate metal portions;

a metal component disposed within the enclosure, the component being mobile within the enclosure, wherein the component comprises two scalloped parallel edges;

a monitor comprising a plurality of electrically conductive elements defining a displacement area for the component inside the enclosure, wherein the component is configured to come into contact with the electrically conductive elements in response to the spatial orientation and/or the change in orientation of the integrated circuit; and a detector configured to detect an electrical link passing through the component and the electrically conductive elements.

20. The integrated circuit according to claim 19, wherein the monitor comprises:

two pairs of electrically insulating pillars disposed within the scallops of the two parallel edges, the electrically insulating pillars of each pair being respectively situated opposite each other within the two scallops, the scallops and the electrically insulating pillars forming a guide for movement of the component;

the base and top sides of the enclosure;

a bar running across the enclosure between the base side and the top side parallel to these sides and between the two pairs of electrically insulating pillars, the bar forming a support axis for the component; and the two metal portions, which respectively belong to the base and top sides and are respectively situated on either side of the support axis to form a first pair of the conductive elements, wherein the other two metal portions respectively belong to the base and top sides and are respectively situated on either side of the support axis to form a second pair of the conductive elements.

21. An integrated circuit, comprising:

a substrate;

a metallization region overlying the substrate and comprising a plurality of metallization levels separated by an insulating region;

a device configured to detect a spatial orientation and/or a change in orientation of the integrated circuit, the device comprising:

an enclosure having sides comprising metal portions formed within ones of the metallization levels, wherein the enclosure comprises a base side comprising two separate metal portions and a top side comprising two separate metal portions;

a metal component disposed within the enclosure, the component being mobile within the enclosure;

a monitor comprising a plurality of electrically conductive elements defining a displacement area for the component inside the enclosure, wherein the component is configured to come into contact with the electrically conductive elements in response to the spatial orientation and/or the change in orientation of the integrated circuit, wherein two metal portions of the base side of the enclosure form a pair of the electrically conductive elements, and wherein the two metal portions of the top side of the enclosure form another pair of the electrically conductive elements; and a detector configured to detect an electrical link passing through the component and the electrically conductive elements.

22. The integrated circuit according to claim 21, wherein the metal component comprises a first block having a thickness equal to a thickness of one metallization level.

23. The integrated circuit according to claim 21, wherein the electrically conductive elements of the monitor define a plurality of pairs of the elements corresponding respectively to a plurality of different spatial orientations of the integrated circuit, and wherein the detector is configured to detect an electrical link passing through the component and through a pair of the electrically conductive elements.

24. The integrated circuit according to claim 21, wherein the monitor comprises:

a bar extending across the enclosure parallel to the base side and the top side, the bar forming a support axis for the component; and a first metal portion of the base side and a second metal portion of the top side that are respectively situated on either side of the support axis to form a first pair of the conductive elements; and a second metal portion of the base side and a first metal portion of the top side that are respectively situated on either side of the support axis to form a second pair of the conductive elements.

25. The integrated circuit according to claim 24, wherein the component comprises two scalloped parallel edges;

wherein the monitor comprises two pairs of electrically insulating pillars disposed within the scallops of the two parallel edges, the electrically insulating pillars of each pair being respectively situated opposite each other within the two scallops, the scallops and the electrically insulating pillars forming a guide for movement of the component; and the bar extends across the enclosure between the two pairs of electrically insulating pillars.

* * * * *